United States Patent
Lu

(10) Patent No.: US 10,276,480 B1
(45) Date of Patent: Apr. 30, 2019

(54) SEMICONDUCTOR STRUCTURE

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/795,201

(22) Filed: Oct. 26, 2017

(51) Int. Cl.
| | |
|---|---|
| H01L 21/44 | (2006.01) |
| H01L 23/498 | (2006.01) |
| H01L 23/31 | (2006.01) |
| H01L 21/48 | (2006.01) |
| H01L 23/00 | (2006.01) |
| H01L 21/56 | (2006.01) |

(52) U.S. Cl.
CPC .... H01L 23/49811 (2013.01); H01L 21/4857 (2013.01); H01L 21/563 (2013.01); H01L 23/3107 (2013.01); H01L 23/3157 (2013.01); H01L 23/49822 (2013.01); H01L 24/16 (2013.01); H01L 24/81 (2013.01); *H01L 2224/16227* (2013.01); *H01L 2224/81801* (2013.01)

(58) Field of Classification Search
CPC ...................................................... H01L 24/20
See application file for complete search history.

(56) References Cited

U.S. PATENT DOCUMENTS

| | | | |
|---|---|---|---|
| 7,094,676 B1* | 8/2006 | Leu | H01L 23/3128 438/611 |
| 7,190,080 B1* | 3/2007 | Leu | H01L 21/568 257/690 |
| 9,653,336 B2 | 5/2017 | Han et al. | |
| 9,735,134 B2* | 8/2017 | Chen | H01L 21/76804 |
| 2012/0319254 A1* | 12/2012 | Kikuchi | H01L 23/5389 257/659 |
| 2014/0182912 A1* | 7/2014 | Lin | H01L 23/49811 174/261 |
| 2016/0133562 A1* | 5/2016 | Lee | H01L 24/19 257/774 |
| 2017/0125346 A1* | 5/2017 | Liu | H01L 21/762 |

* cited by examiner

*Primary Examiner* — Thao P Le
(74) *Attorney, Agent, or Firm* — Foley & Lardner LLP; Cliff Z. Liu

(57) ABSTRACT

A substrate structure includes a dielectric layer, a first circuit layer, a second circuit layer and at least one conductive pillar. The dielectric layer has a first surface and a second surface opposite to the first surface. The first circuit layer is disposed adjacent to the first surface of the dielectric layer. The second circuit layer is disposed adjacent to the second surface of the dielectric layer and electrically connected to the first circuit layer. The second circuit layer includes a plurality of pads and at least one trace disposed between two adjacent pads of the plurality of pads. The at least one conductive pillar is tapered toward the second circuit layer and disposed on one of the pads. A portion of the second surface of the dielectric layer is exposed from the second surface layer.

20 Claims, 14 Drawing Sheets

SEMICONDUCTOR STRUCTURE

BACKGROUND

1. Field of the Disclosure

The present disclosure relates to a substrate structure, a semiconductor package structure and a manufacturing method, and to a substrate structure including at least one tapered conductive pillar, a semiconductor package structure including the substrate structure, and a method for manufacturing the substrate structure.

2. Description of the Related Art

In an electronic device, functionality improvement and size reduction can be achieved by changing the materials thereof, or by changing the structural design thereof. When the materials of the electronic device are changed, the settings or parameters of production equipment and the manufacturing methods may be modified accordingly, which can be complicated and expensive as compared to adjusting the structural design thereof. An efficient way for improving functionality and reducing size of the electronic device is achieved by a structural design with a reduced line width/ line space (L/S) and increasing a number of, or density of, circuit layers. However, an input/output (I/O) count and a total thickness of such an electronic device are issues of concern.

SUMMARY

In some embodiments, according to an aspect, a substrate structure includes a dielectric layer, a first circuit layer, a second circuit layer and at least one conductive pillar. The dielectric layer includes a first surface and a second surface opposite to the first surface. The first circuit layer is disposed adjacent to the first surface of the dielectric layer. The second circuit layer is disposed adjacent to the second surface of the dielectric layer and electrically connected to the first circuit layer. The second circuit layer includes a plurality of pads and at least one trace disposed between two adjacent pads of the plurality of pads. The conductive pillar is tapered downwardly and disposed on one of the pads of the plurality of pads. A portion of the second surface of the dielectric layer is exposed from the second circuit layer.

In some embodiments, according to another aspect, a semiconductor package structure includes a substrate structure, a semiconductor die and an encapsulant. The substrate structure includes a dielectric layer, a first circuit layer, a second circuit layer and at least one conductive pillar. The dielectric layer includes a first surface and a second surface opposite to the first surface. The first circuit layer is disposed adjacent to the first surface of the dielectric layer. The second circuit layer is disposed on the second surface of the dielectric layer and electrically connected to the first circuit layer. The second circuit layer includes a plurality of pads and at least one trace disposed between two adjacent pads of the plurality of pads. The conductive pillar is tapered downwardly and disposed on one of the pads of the plurality of pads. The semiconductor die is electrically connected to the at least one conductive pillar of the substrate structure. The encapsulant is disposed between the substrate structure and the semiconductor die, and directly contacts a portion of the second circuit layer.

In some embodiments, according to another aspect, a semiconductor process includes (a) forming a first circuit layer; (b) forming a second circuit layer electrically connected to the first circuit layer, wherein the second circuit layer includes a plurality of pads and at least one trace disposed between two adjacent pads of the plurality of pads; (c) forming a first photoresist layer on the second circuit layer, the first photoresist layer defining one or more recesses; (d) forming at least one conductive pillar tapered downwardly in at least one of the recesses of the first photoresist layer and electrically connected to at least one of the pads of the plurality of pads; and (e) removing the first photoresist layer to form a substrate structure.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
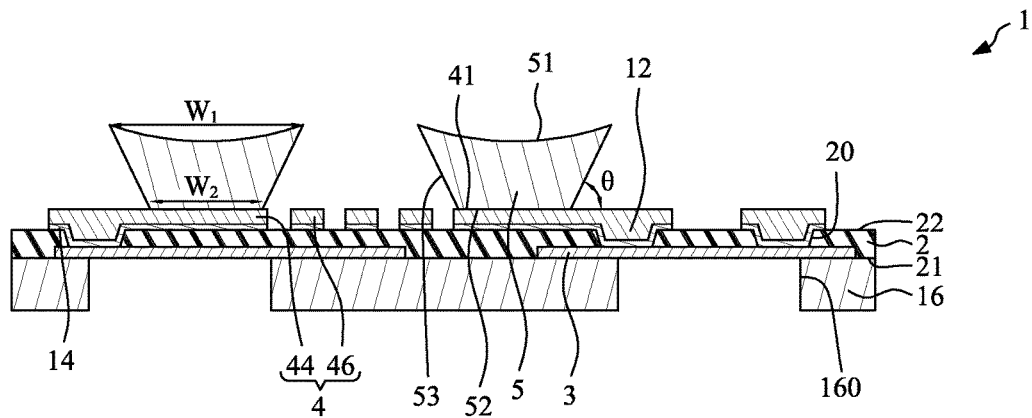
FIG. 1 illustrates a cross-sectional view of an example of a substrate structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure disclose a substrate structure including at least one tapered conductive pillar. At least some embodiments of the present disclosure further disclose a semiconductor package structure including the substrate structure, and techniques for manufacturing the substrate structure and/or the semiconductor package structure.

In a substrate structure, the traces and the bump pads for external connection can be disposed at a same level. Since the bump pads are provided with sufficient area for external connection, a line width/line space (L/S) of such a substrate structure can be correspondingly limited. Besides, when a semiconductor die is connected to the bump pads of the substrate structure by using solder structures, overflow of the solder may readily occur, which can result in bridges between the bump pads and the adjacent traces.

In one or more implementations, bump pads and the traces are disposed separately at different layers to avoid such bridges therebetween. However, such design can increase manufacturing cost and total thickness of the substrate structure due to the additional layer(s).

Other implementations provide for conductive pillars protruding from the circuit layer for connecting to a semiconductor die, such that solder structures and trace are not disposed at a same level. Accordingly, bridges caused by solder overflow can be avoided. However, the conductive pillars can be in a columnar shape with a consistent radius. For such pillars, when the area of the upper surface of the conductive pillar is sufficient for retaining the solder, the lower surface of the conductive pillar can occupy a large area of the circuit layer, resulting in a specification of a narrow line width/line space (L/S), which can be challenging to implement.

To address at least the above concerns, one or more embodiments of the present disclosure provides a substrate structure including at least one tapered conductive pillar. The tapered conductive pillar provides a larger upper surface which is at least sufficient for connection with a semiconductor die, and a smaller lower surface to reduce an occupied area of a circuit layer on which the conductive pillar is disposed.

FIG. 1 illustrates a cross-sectional view of an example of a substrate structure 1 according to some embodiments of the present disclosure. The substrate structure 1 includes a dielectric layer 2, a first circuit layer 3, a second circuit layer 4, a plurality of inner vias 12, at least one conductive pillar 5 and a protective layer 16.

The dielectric layer 2 has a first surface 21 and a second surface 22 opposite to the first surface 21. The dielectric layer 2 may include an insulating material or a dielectric material, such as, for example, polypropylene (PP). It is noted that the dielectric layer 2 may include, or be formed from, a cured photoimageable dielectric (PID) material such as epoxy or polyimide (PI) including photoinitiators. The dielectric layer 2 defines a plurality of through holes 20 extending between the first surface 21 and the second surface 22. In some embodiments, a thickness of the dielectric layer 2 may be in a range of about 3 micrometers (μm) to about 10 μm.

The first circuit layer 3 is disposed adjacent to the first surface 21 of the dielectric layer 2. For example, the first circuit layer 3 is embedded in the dielectric layer 2 and exposed from the first surface 21 of the dielectric layer 2. In some embodiments, the first circuit layer 3 is a patterned conductive circuit layer. A material of the first circuit layer 3 may include a conductive metal, such as copper, or another metal or combination of metals. In some embodiments, the first circuit layer 3 may be formed by etching a metal layer. In some embodiments, the line width/line space (L/S) of the first circuit layer 3 may be greater than about 7 μm/about 7 μm (e.g. may be greater than about 8 μm/about 8 μm, may be greater than about 9 μm/about 9 μm, or may be greater than about 10 μm/about 10 μm), and a thickness of the first circuit layer 3 may be in a range of about 2 μm to about 5

μm. As shown in FIG. 1, the first circuit layer 3 may have a substantially consistent thickness, and a bottom surface of the first circuit layer 3 may be substantially coplanar with the first surface 21 of the dielectric layer 2. One or more portions of a top surface of the first circuit layer 3 are exposed by the through holes 20 of the dielectric layer 2.

Figure 4:
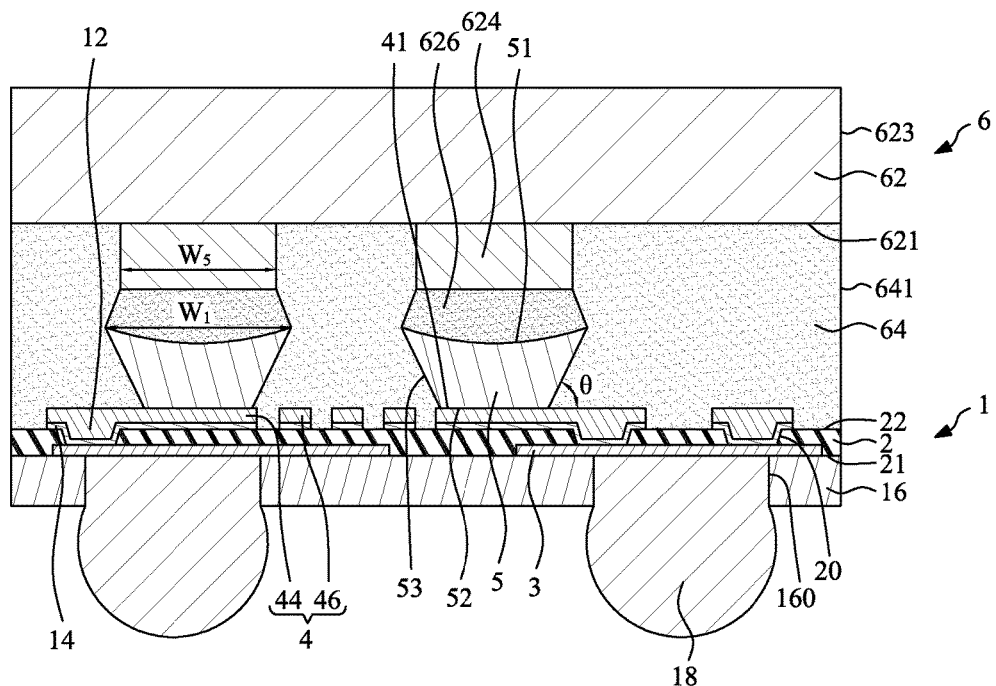
FIG. 4 illustrates a cross-sectional view of an example of a semiconductor package structure according to some embodiments of the present disclosure.

The second circuit layer 4 is disposed adjacent to the second surface 22 of the dielectric layer 2 and electrically connected to the first circuit layer 3. For example, the second circuit layer 4 is disposed on the second surface 22 of the dielectric layer 2, while a portion of the second surface 22 of the dielectric layer 2 is a free surface that is not covered by any other portion or component of the substrate structure 1 (or, in some implementations, not covered by any element or material), or is exposed from the second circuit layer 4. In some embodiments, the second circuit layer 4 is includes a redistribution layer (RDL). The second circuit layer 4 has an upper surface 41, and includes a plurality of pads 44 and at least one trace 46. The trace 46 is connected (electrically connected and/or physically connected) to at least one of the pads 44 and is disposed between two adjacent pads 44. A material of the second circuit layer 4 may include a conductive metal, such as copper, or another metal or combination of metals, and may be formed or disposed by electroplating. Each of the inner vias 12 is disposed in a respective one of the through holes 20 of the dielectric layer 2 and extends between the first circuit layer 3 and the second circuit layer 4. Thus, the second circuit layer 4 is electrically connected to the first circuit layer 3 through the inner vias 12. The vias 12 may be formed concurrently with the second circuit layer 4. In some embodiments, a line width/line space (L/S) of the second circuit layer 4 is less than a line width/line space (L/S) of the first circuit layer 3. The line width/line space (L/S) of the second circuit layer 4 may be less than about 7 μm/about 7 μm, such as less than about 5 μm/about 5 μm, less than about 3 μm/about 3 μm, or less than about 2 μm/about 2 μm. In some embodiments, a thickness of the second circuit layer 4 may be in a range of about 4 μm to about 6 μm. Thus, a thickness of the first circuit layer 3 is less than a thickness of the second circuit layer 4, which can balance warpage of the substrate structure 1 caused by connection of a semiconductor die 62 (e.g. as shown in FIG. 4) to the second circuit layer 4. A roughness (Ra) of the upper surface 41 of the second circuit layer 4 may be less than about 50 nanometer (nm), such as less than about 40 nm or less than about 30 nm. In some embodiments, a seed layer 14 may be disposed between the second circuit layer 4 and the dielectric layer 2, and between the inner vias 12 and the dielectric layer 2. The seed layer 14 is covered (e.g. is completely covered) by the second circuit layer 4 and the inner vias 12. The seed layer 14 may include, for example, titanium and/or copper, another metal, or an alloy thereof, and may be formed or disposed by sputtering.

The conductive pillar 5 is tapered downwardly towards the second surface 22 (e.g. a width of the conductive pillar 5 decreases, e.g. monotonically decreases) from an upper portion of the conductive pillar 5 to a lower portion of the conductive pillar 5) and disposed on one of the pads 44 of the second circuit layer 4. In some embodiments, the conductive pillar 5 is directly disposed on the one of the pads 44 of the second circuit layer 4. The conductive pillar 5 has an upper surface 51, a lower surface 52 and a sidewall 53. The lower surface 52 is opposite to the upper surface 51, and the sidewall 53 extends between the lower surface 52 and the upper surface 51. In some embodiments, the lower surface 52 of the conductive pillar 5 is connected to and physically contacts the respective pad 44 of the second circuit layer 4.

In some embodiments, the conductive pillar 5 may be shaped as a circular truncated cone. The upper surface 51 and the lower surface 52 may be substantially circular.

A material of the conductive pillar 5 may include a conductive metal, such as copper, or another metal or combination of metals, and may be formed or disposed by electroplating. The material of the conductive pillar 5 may be the same as the material of the second circuit layer 4. In some embodiments, there is no seed layer between the conductive pillar 5 and the upper surface 41 of the second circuit layer 4, the conductive pillar 5 can grow directly from the upper surface 41 of the second circuit layer 4, and thus lattices of the second circuit layer 4 and the conductive pillars 5 may be continuous (e.g. the second circuit layer 4 and at least one of the conductive pillars 5 may share a solid or crystalline lattice). In some embodiments, the conductive pillar 5 and the second circuit layer 4 may be a continuous structure without a boundary therebetween (e.g. may constitute a monolithic structure). In one or more embodiments, the conductive pillar 5 is directly located on part of the second circuit layer 4, and the lattice of the conductive pillar 5 is the same as that of the second circuit layer 4. In some embodiments, the conductive pillar 5 includes electroplated copper, which is directly formed on the upper surface 41 of the second circuit layer 4 by electroplating. Therefore, it can be seen by using, for example, a focused ion beam (FIB), that an interface between the conductive pillar 5 and the second circuit layer 4 is not visible or non-existent, and the conductive pillar 5 and the second circuit layer 4 have the same lattice.

The conductive pillar 5 is tapered from the upper surface 51 to the lower surface 52. A width $W_1$ of the upper surface 51 is greater than a width $W_2$ of the lower surface 52, for example, at least about 1.05 times greater, at least about 1.1 times greater, at least about 1.2 times greater, or at least about 1.3 times greater. Thus, the shape of the conductive pillar 5 from the cross-sectional view as shown in FIG. 1 is substantially a trapezoid (e.g. a trapezoid with a concave upper surface), and the width of the conductive pillar 5 decreases from the upper surface 51 toward the lower surface 52. In addition, an angle θ is defined by the sidewall 53 of the conductive pillar 5 and an upper surface 41 of the second circuit layer 4. The angle θ is equal to or greater than about 60 degrees but less than about 90 degrees. For example, the angle θ is equal to or greater than about 65 degrees but less than about 87 degrees; equal to or greater than about 70 degrees but less than about 85 degrees; or equal to or greater than about 75 degrees but less than about 82 degrees. In some embodiments, an edge (e.g. a top edge) of an upper portion (e.g. the upper surface 51) of the conductive pillar 5 is directly located above the trace 46 of the second circuit layer 4. In some embodiments, the conductive pillar 5 is a monolithic structure, and the sidewall 53 thereof is a continuous surface. In some embodiments, a maximum height of the conductive pillar 5 may be in a range of about 50 μm to about 100 μm.

In some embodiments, the upper surface 51 of the conductive pillar 5 is concave toward the second circuit layer 4. That is, the upper portion of the conductive pillar 5 is substantially in a bowl shape. When the substrate structure 1 is connected to a semiconductor die 62 (as shown in FIG. 4), the conductive pillar 5 can retain or receive a solder structure 626 of the semiconductor die 62 in the concave upper surface 51 so as to prevent a bridge between the conductive pillar 5 and the trace 46.

The protective layer 16 is disposed on the first surface 21 of the dielectric layer 2 and the first circuit layer 3. The protective layer 16 may include, or be formed from, a cured PID material such as epoxy or a PI including photoinitiators, or a solder resist layer. The protective layer 16 defines an opening 160 extending through the protective layer 16. A portion of the first circuit layer 3 is exposed in the opening 160 for external connection. In some embodiments, a thickness of the protective layer 16 may be in a range of about 25 μm to about 90 μm.

In the substrate structure 1, since the conductive pillar 5 is tapered downwardly, the upper surface 51 is large enough to retain the solder structure 626 thereon when connecting to the semiconductor die 62 (as shown in FIG. 4), avoiding a potential short circuit caused by overflow of the solder of the solder structure 626. The lower surface 52 of the conductive pillar is smaller than the upper surface 51, and thus a size of the pad 44 on which the lower surface 52 is disposed can be correspondingly reduced. Accordingly, the pads 44 occupy a relatively small area of the second surface 22 of the dielectric layer 2, as compared to implementations that omit a tapered conductive pillar 5, while the remaining area of the second surface 22 of the dielectric layer 2 can be increased. The line width/line space (L/S) of the second circuit layer 4 can thus be larger than would otherwise be the case, which provides for use of less costly or faster lithography techniques or processes.

Figure 2:
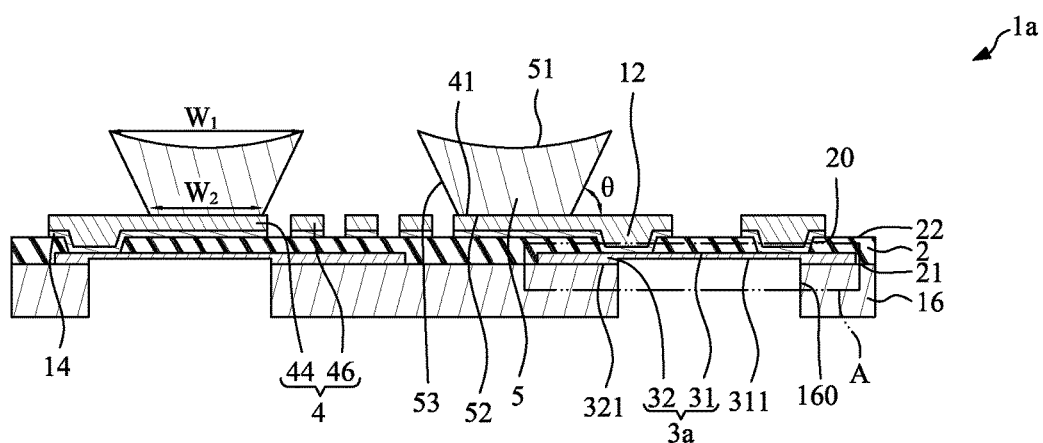
FIG. 2 illustrates a cross-sectional view of an example of a substrate structure according to some embodiments of the present disclosure.
Figure 3:
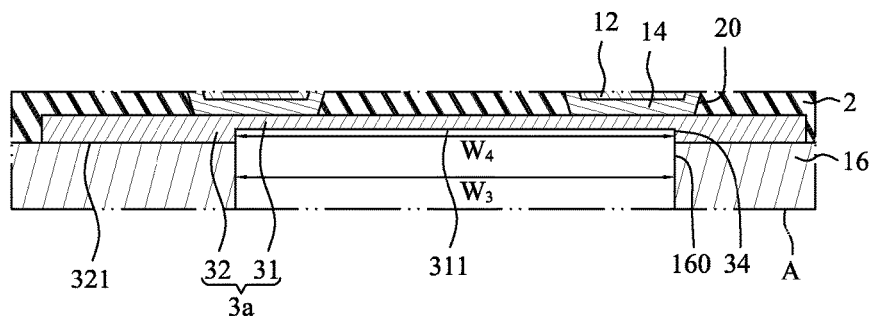
FIG. 3 illustrates an enlarged view of an area "A" shown in FIG. 2.

FIG. 2 illustrates a cross-sectional view of an example of a substrate structure 1a according to some embodiments of the present disclosure. FIG. 3 illustrates an enlarged view of the area "A" shown in FIG. 2. The substrate structure 1a is similar to the substrate structure 1 shown in FIG. 1, except that the structure of a first circuit layer 3a of the substrate structure 1a is different from the first circuit layer 3 of the substrate structure 1 in FIG. 1.

The first circuit layer 3a includes a first portion 31 and a second portion 32 surrounding the first portion 31. The first portion 31 has a surface 311, and the second portion 32 has a surface 321. In some embodiments, the surface 321 of the second portion 32 is substantially coplanar with the first surface 21 of the dielectric layer 2. The surface 311 of the first portion 31 is recessed from the first surface 21 of the dielectric layer 2 and the surface 321 of the second portion 32. That is, the first circuit layer 3a defines a recess portion 34 corresponding to the first portion 31.

The protective layer 16 covers the second portion 32 of the first circuit layer 3a. The opening 160 of the protective layer 16 corresponds to the first portion 31 of the first circuit layer 3a. Accordingly, the opening 160 defined by the protective layer 16 exposes (e.g. completely exposes) the first portion 31 of the first circuit layer 3a, and the recess portion 34 of the first circuit layer 3a is substantially co-extensive with the opening 160 of the protective layer 16. In some embodiments, as shown in FIG. 3, a width $W_3$ of the opening 160 of the protective layer 16 is substantially equal to a width $W_4$ of the recess portion 34 of the first circuit layer 3a. In one or more embodiments in which a solder ball is disposed in the opening 160 of the protective layer 16 and attached to the first circuit layer 3a, the recess portion 34 of the first circuit layer 3a provides enlarged contacting area between the solder ball and the first circuit layer 3a.

FIG. 4 illustrates a cross-sectional view of an example of a semiconductor package structure 6 according to some embodiments of the present disclosure. The semiconductor package structure 6 includes a substrate structure 1, a semiconductor die 62, an encapsulant 64 and a solder ball 18.

The substrate structure 1 shown in FIG. 4 is similar to the substrate structure 1 shown in FIG. 1. The semiconductor die 62 is disposed on the substrate structure 1 and electrically connected to the conductive pillar 5 of the substrate structure 1. In some embodiments, a thickness of the semiconductor die 62 may be about 500 μm (e.g. may be in a range of about 400 μm to about 600 μm). The semiconductor die 62 includes an active surface 621, a side surface 623, at least one bump 624 and at least one solder structure 626. The active surface 621 of the semiconductor die 62 faces the substrate structure 1. The bump 624 of the semiconductor die 62 is disposed on the active surface 621, and is connected to the conductive pillar 5 of the substrate structure 1 through the solder structure 626. In other words, the solder structure 626 is disposed between the conductive pillar 5 and the bump 624. A width $W_1$ of the upper surface of the conductive pillar 5 is greater than a width $W_5$ of the bump 624 of the die 62. In some embodiments, the solder structure 626 contacts the upper surface 51 of the conductive pillar 5.

The encapsulant 64, for example, a molding compound, is disposed between the substrate structure 1 and the semiconductor die 62, and directly contacts a portion of the second circuit layer 4. The encapsulant 64 may cover the active surface 621 of the semiconductor die 62 without covering the side surface 623 of the semiconductor die 62. As shown in FIG. 4, a side surface 641 of the encapsulant 64 may be substantially coplanar with the side surface 623 of the semiconductor die 62. In some embodiments, the encapsulant 64 covers (e.g. completely covers) a sidewall 53 of the conductive pillar 5. For example, the encapsulant 64 directly contacts the sidewall 53 of the conductive pillar 5. In some embodiments, the encapsulant 64 contacts a portion of the second surface 22 of the dielectric layer 2 of the substrate structure 1. In some embodiments, a thickness of the encapsulant 64 may be in a range of about 60 μm to about 150 μm.

The solder ball 18 is disposed in the opening 160 of the protective layer 16 of the substrate structure 1. The solder ball 18 is attached and electrically connected to the first circuit layer 3 and protrudes from the protective layer 16 for external connection. In some embodiments, the substrate structure 1 of the semiconductor package structure 6 can be replaced by the substrate structure 1a shown in FIG. 2 and FIG. 3.

Figure 5:
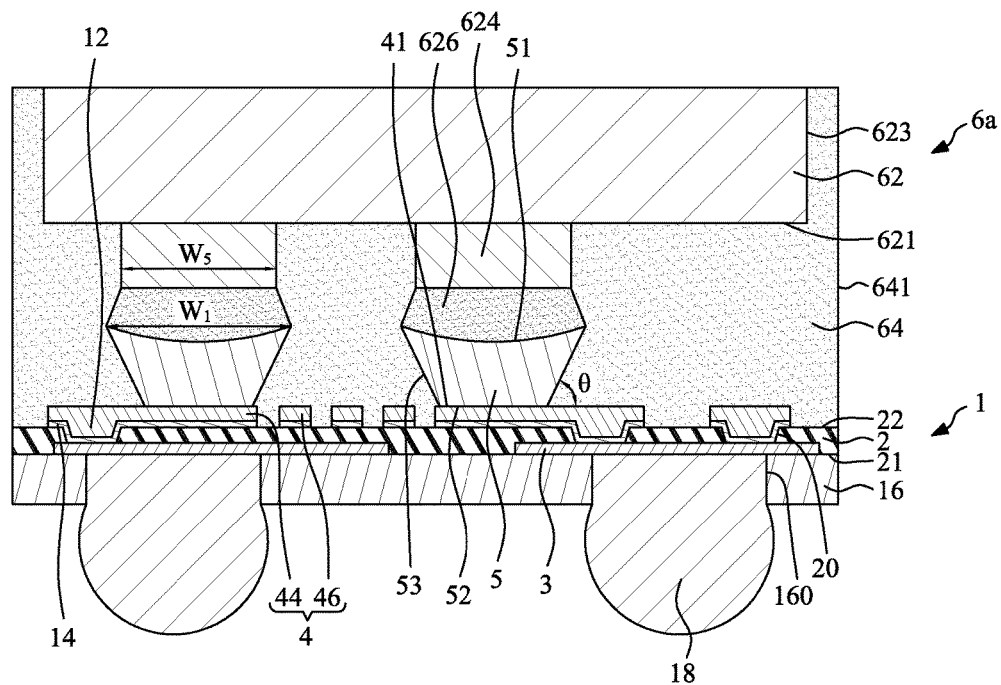
FIG. 5 illustrates a cross-sectional view of an example of a semiconductor package structure according to some embodiments of the present disclosure.

FIG. 5 illustrates a cross-sectional view of an example of a semiconductor package structure 6a according to some embodiments of the present disclosure. The semiconductor package structure 6a is similar to the semiconductor package structure 6 shown in FIG. 4, except that the encapsulant 64 further covers the side surface 623 of the semiconductor die 62.

Figure 6:
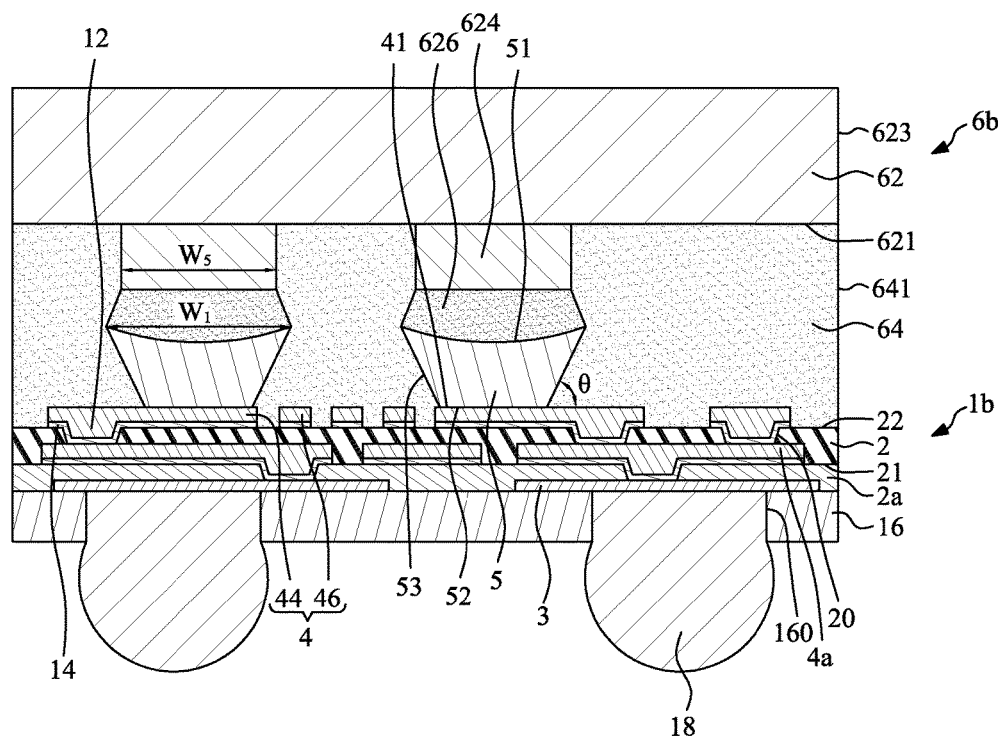
FIG. 6 illustrates a cross-sectional view of an example of a semiconductor package structure according to some embodiments of the present disclosure.

FIG. 6 illustrates a cross-sectional view of an example of a semiconductor package structure 6b including a substrate structure 1b according to some embodiments of the present disclosure. The semiconductor package structure 6b including the substrate structure 1b is similar to the semiconductor package structure 6 including the substrate structure 1 shown in FIG. 4, except that the substrate structure 1b of the semiconductor package structure 6b includes an additional dielectric layer 2a and an intermediate circuit layer 4a respectively similar to the dielectric layer 2 and the second circuit layer 4. The additional dielectric layer 2a is disposed between the dielectric layer 2 and the first circuit layer 3. The intermediate circuit layer 4a is disposed between the dielectric layer 2 and the additional dielectric layer 2a, and is electrically connected to the first circuit layer 3 and the second circuit layer 4. In other embodiments, the substrate structure 1b of the semiconductor package structure 6b may include more than one additional dielectric layer 2a and/or more than one intermediate circuit layer 4a.

FIG. 7 through FIG. 26 illustrate a semiconductor process according to some embodiments of the present disclosure. In some embodiments, the semiconductor process is for manufacturing a substrate structure such as the substrate structure 1 shown in FIG. 1, and/or a semiconductor package structure such as the semiconductor structure 6a shown in FIG. 5.

Figure 7:
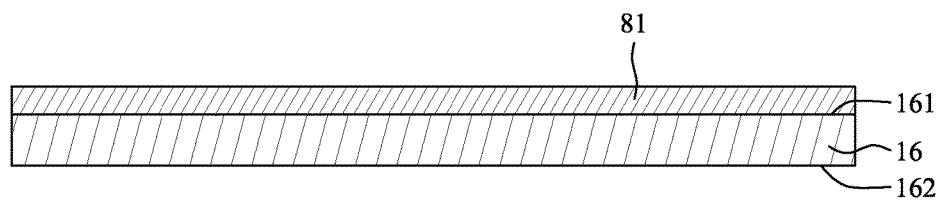
FIG. 7 illustrates one or more stages of an example of a semiconductor process according to some embodiments of the present disclosure.

Referring FIG. 7, a protective layer 16 and a metal layer 81 are provided. The protective layer 16 may include a PID material, such as epoxy or a PI including photoinitiators, or a solder resist layer. The metal layer 81 may include copper or other conductive metals or an alloy thereof. The protective layer 16 has a first side 161 and a second side 162 opposite to the first side 161. The metal layer 81 is disposed on the first side 161 of the protective layer 16.

Figure 8:
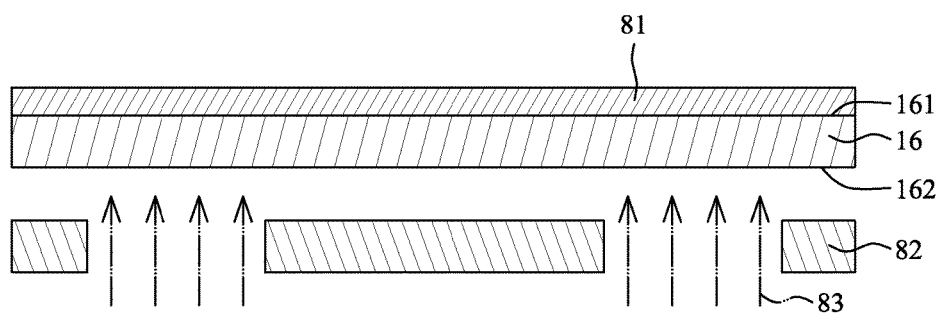
FIG. 8 illustrates one or more stages of an example of a semiconductor process according to some embodiments of the present disclosure.

Referring to FIG. 8, the protective layer 16 is exposed to a pattern of light. For example, a mask 82 is disposed adjacent to the second side 162 of the protective layer 16, so as to cover a portion of the protective layer 16. Then, the protective layer 16 is exposed to a radiation source 83.

Figure 9:
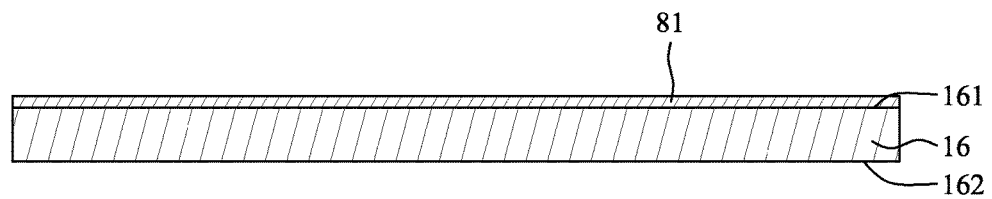
FIG. 9 illustrates one or more stages of an example of a semiconductor process according to some embodiments of the present disclosure.

Referring to FIG. 9, an etching process is conducted to the metal layer 81 to reduce a thickness of the metal layer 81 (e.g. before developing the protective layer 16). Since the protective layer 16 is not yet developed, the protective layer 16 can readily support the thinned metal layer 81.

Figure 10:
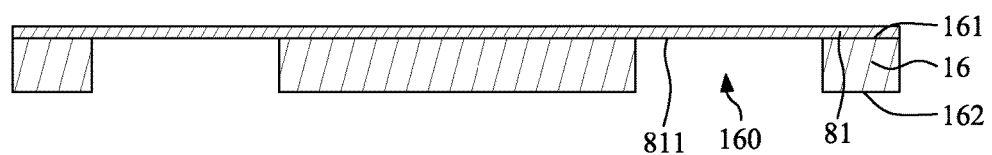
FIG. 10 illustrates one or more stages of an example of a semiconductor process according to some embodiments of the present disclosure.

Referring to FIG. 10, the protective layer 16 is then developed by a developer from the second side 162. That is, the protective layer 16 is patterned, and a portion 811 of the metal layer 82 is exposed from the protective layer 16. For example, the protective layer 16 defines at least one opening 160 extending through the protective layer 16. The portion 811 of the metal layer 81 is exposed in the opening 160 of the protective layer 16.

Figure 11:
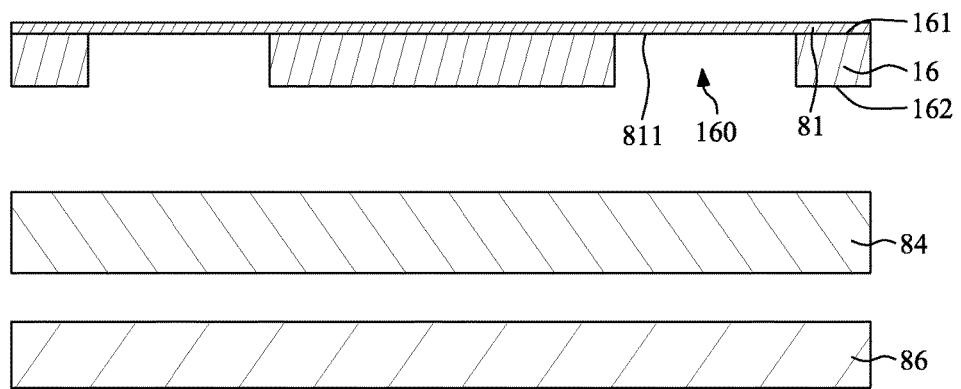
FIG. 11 illustrates one or more stages of an example of a semiconductor process according to some embodiments of the present disclosure.

Referring to FIG. 11, a carrier 86 is attached to the second side 162 of the protective layer 16 through an adhesive layer 84 for support.

Figure 12:
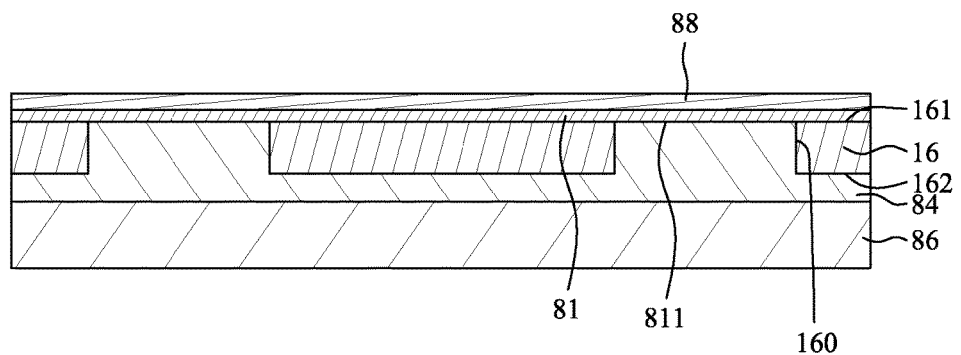
FIG. 12 illustrates one or more stages of an example of a semiconductor process according to some embodiments of the present disclosure.

Referring to FIG. 12, a first photoresist material 88 is applied on the metal layer 81. The first photoresist material 88 may include a PID material, such as epoxy or a PI including photoinitiators.

Figure 13:
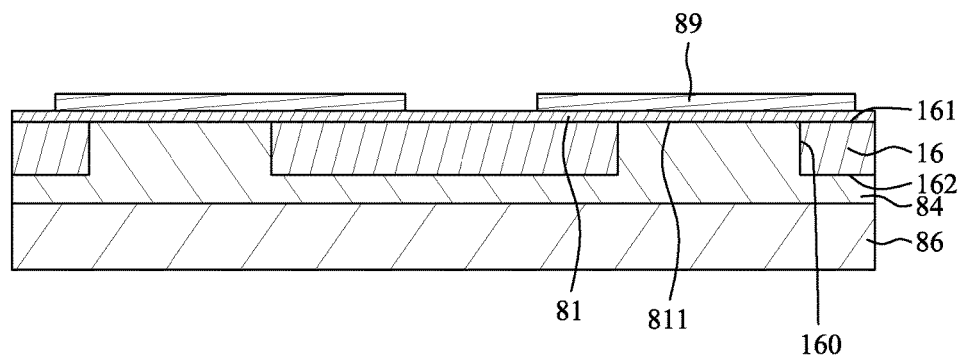
FIG. 13 illustrates one or more stages of an example of a semiconductor process according to some embodiments of the present disclosure.

Referring to FIG. 13, the first photoresist material 88 is patterned (e.g., by a lithography technique) to form at least one rigid portion 89.

Figure 14:
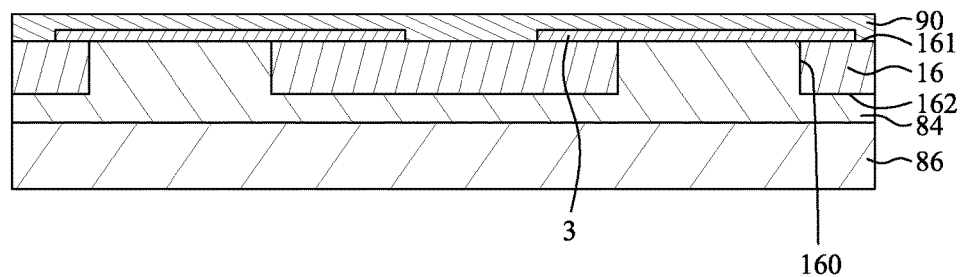
FIG. 14 illustrates one or more stages of an example of a semiconductor process according to some embodiments of the present disclosure.

Referring to FIG. 14, the metal layer 81 is patterned (e.g., by etching with the rigid portion 89 serving as a mask), to form a first circuit layer 3. The rigid portion 89 is then removed, (e.g., by stripping). Then, a dielectric material 90 is applied on and covers the first side 161 of the protective layer 16 and the first circuit layer 3. The dielectric material 90 may include PP, or a PID material such as epoxy or a PI including photoinitiators.

Figure 15:
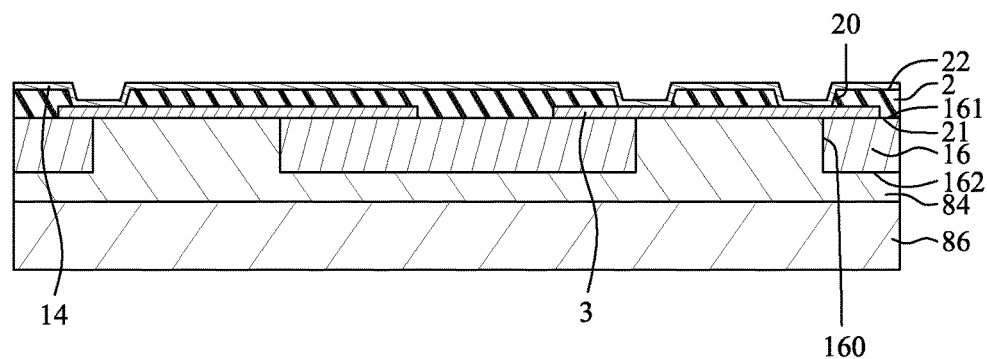
FIG. 15 illustrates one or more stages of an example of a semiconductor process according to some embodiments of the present disclosure.

Referring to FIG. 15, the dielectric material 90 is patterned (e.g., by a lithography technique) to form a dielectric layer 2 on the first circuit layer 3. The dielectric layer 2 has a first surface 21 and a second surface 22 opposite to the first surface 21, and the first surface 21 is disposed on the first side 161 of the protective layer 16. The dielectric layer 2 defines a plurality of through holes 20 extending between the first surface 21 and the second surface 22 to expose portions of the first circuit layer 3. Then, a seed layer 14 is formed (e.g., by sputtering) on the second surface 22 of the dielectric layer 2 and in the through holes 20 of the dielectric layer 2 to contact the first circuit layer 3.

Figure 16:
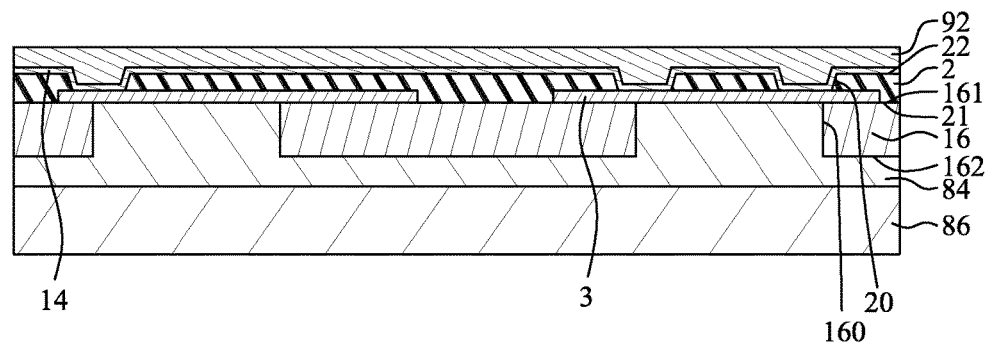
FIG. 16 illustrates one or more stages of an example of a semiconductor process according to some embodiments of the present disclosure.

Referring to FIG. 16, a second photoresist material 92 is provided or applied on the seed layer 14. The second photoresist material 92 may include a PID material, such as epoxy or a PI including photoinitiators.

Figure 17:
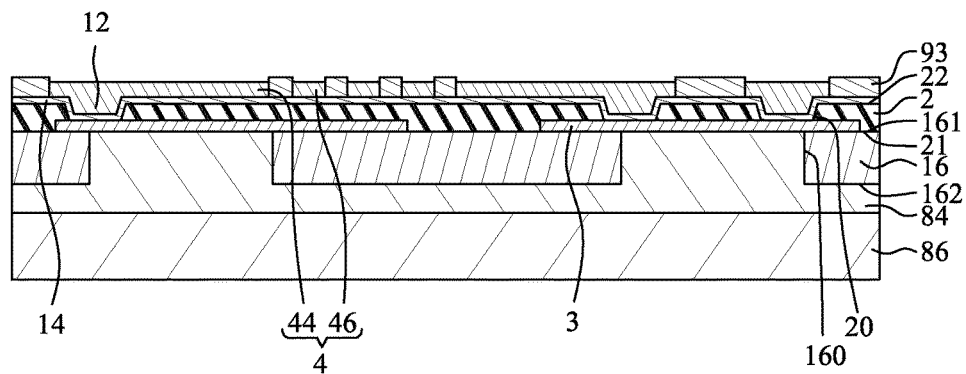
FIG. 17 illustrates one or more stages of an example of a semiconductor process according to some embodiments of the present disclosure.

Referring to FIG. 17, the second photoresist material 92 is patterned (e.g., by a lithography technique) to form a first photoresist layer 93 on the seed layer 14. Then, a second circuit layer 4 is formed (e.g., by electroplating) on the seed layer 14 and in recesses of the first photoresist layer 93. The second circuit layer 4 is electrically connected to the first circuit layer 3. The second circuit layer 4 includes a plurality of pads 44 and at least one trace 46. The trace 46 is connected to at least one of the pads 44 and is disposed between two adjacent pads 44. A material of the second circuit layer 4 may include a conductive metal, such as copper, or another metal or combination of metals, and may be formed or disposed by electroplating. In addition, a plurality of inner vias 12 are respectively disposed (e.g., by electroplating) in ones of the through holes 20 of the dielectric layer 2 to connect the first circuit layer 3 and the second circuit layer 4. The inner vias 12 can be formed concurrently with the second circuit layer 4.

Figure 18:
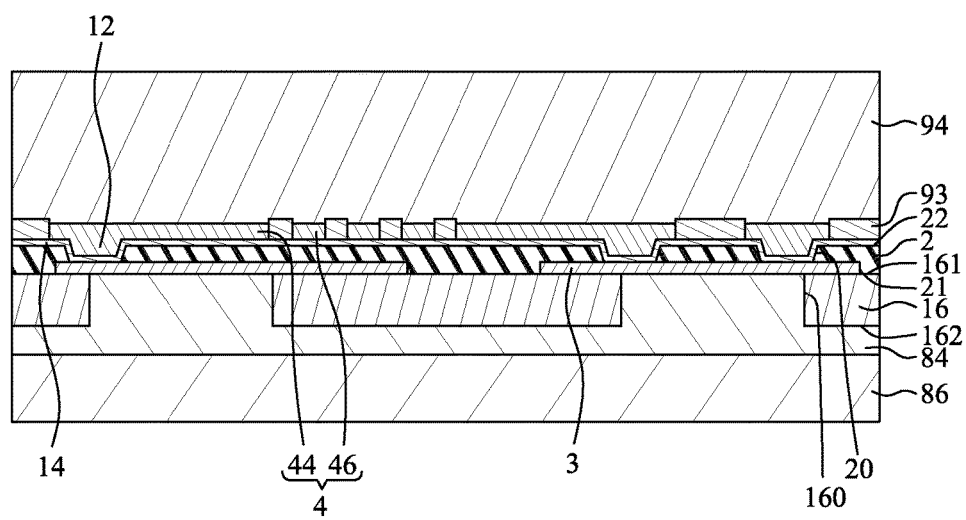
FIG. 18 illustrates one or more stages of an example of a semiconductor process according to some embodiments of the present disclosure.

Referring to FIG. 18, a third photoresist material 94 is disposed on the first photoresist layer 93 and the second circuit layer 4. The third photoresist material 94 may include a PID material, such as epoxy or a polyimide PI including photoinitiators.

Figure 19:
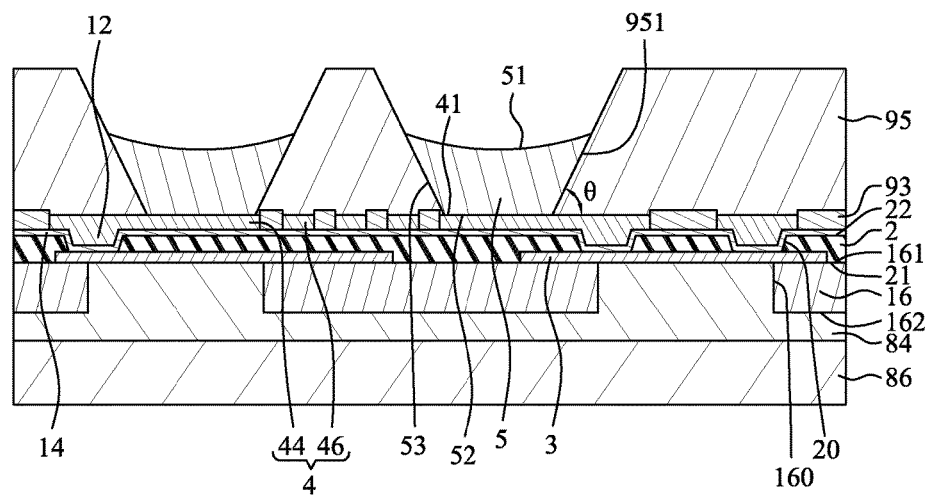
FIG. 19 illustrates one or more stages of an example of a semiconductor process according to some embodiments of the present disclosure.

Referring to FIG. 19, the third photoresist material 94 is patterned (e.g., by a lithography technique) to form a second photoresist layer 95 on the second circuit layer 4. The second photoresist layer 95 defines at least one opening 951 to expose a portion of an upper surface 41 of the pad 44 of the second circuit layer 4. Then, at least one conductive pillar 5 tapered downwardly is formed in the opening 951 of the second photoresist layer 95 and electrically connected to one of the pads 44 of the second circuit layer 4. The conductive pillar 5 may be directly disposed on the one of the pads 44 of the second circuit layer 4. The conductive pillar 5 has an upper surface 51, a lower surface 52 opposite to the upper surface 51, and a sidewall 53. A material of the conductive pillar 5 may include a conductive metal, such as copper, or another metal or combination of metals, and may be formed or disposed by electroplating. The material of the conductive pillar 5 may be the same as the material of the second circuit layer 4. In some embodiments, there is no seed layer between the conductive pillar 5 and the upper surface 41 of the second circuit layer 4, the conductive pillar 5 can grow directly from the upper surface 41 of the second circuit layer 4, and lattices of the second circuit layer 4 and the conductive pillars 5 may be continuous. In some embodiments, the conductive pillar 5 and the second circuit layer 4 may be continuous without a boundary therebetween. The conductive pillar 5 is directly located on a portion of the second circuit layer 4, wherein the lattice of the conductive pillar 5 is the same as that of the second circuit layer 4 (e.g. the conductive pillar 5 and the second circuit layer 4 share a lattice). In this embodiment, the conductive pillar 5 is made from electroplated copper, which is directly formed on the upper surface 41 of the second circuit layer 4 by electroplating. Therefore, it can be seen by using, for example, a focused ion beam (FIB), that an interface between the conductive pillar 5 and the second circuit layer 4 is not visible (or is non-existent), and the conductive pillar 5 and the second circuit layer 4 have the same lattice. In some embodiments, as shown in FIG. 19, a width of the upper surface 51 is greater than a width of the lower surface 52, and the upper surface 51 of the conductive pillar 5 is concave. An angle θ defined by the sidewall 53 of the conductive pillar 5 and the upper surface 41 of the second circuit layer 4 is equal to or greater than about 60 degrees but less than about 90 degrees. In some embodiments, an edge (e.g. a top edge) of an upper portion (e.g. the upper surface 51) of the conductive pillar 5 is directly located above the trace 46 of the second circuit layer 4.

Figure 20:
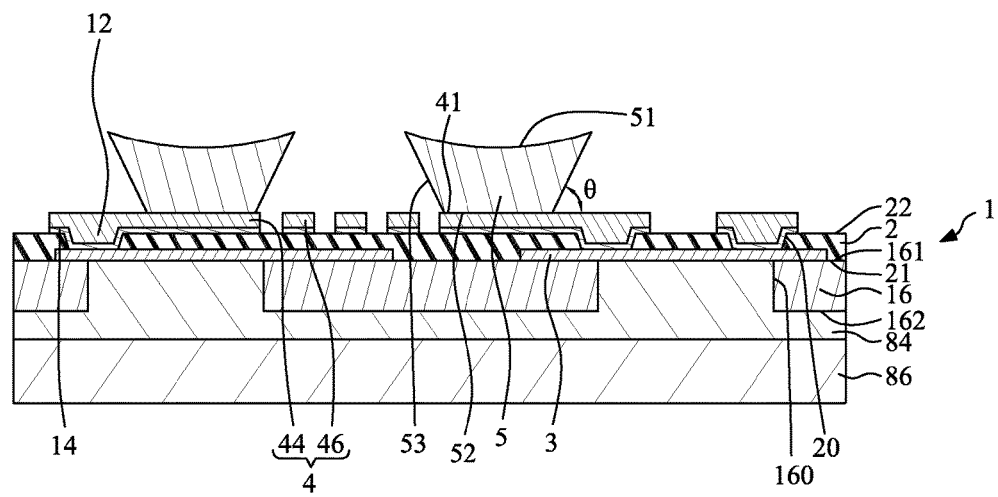
FIG. 20 illustrates one or more stages of an example of a semiconductor process according to some embodiments of the present disclosure.

Referring to FIG. 20, the first photoresist layer 93 and the second photoresist layer 95 are removed (e.g., by stripping). A portion of the seed layer 14 which is not covered by the second circuit layer 4 and the inner vias 12 is removed (e.g., by etching). Accordingly, a substrate structure 1 as shown in FIG. 1 is formed on the carrier 86 and attached to the carrier 86 by the adhesive layer 84.

Figure 21:
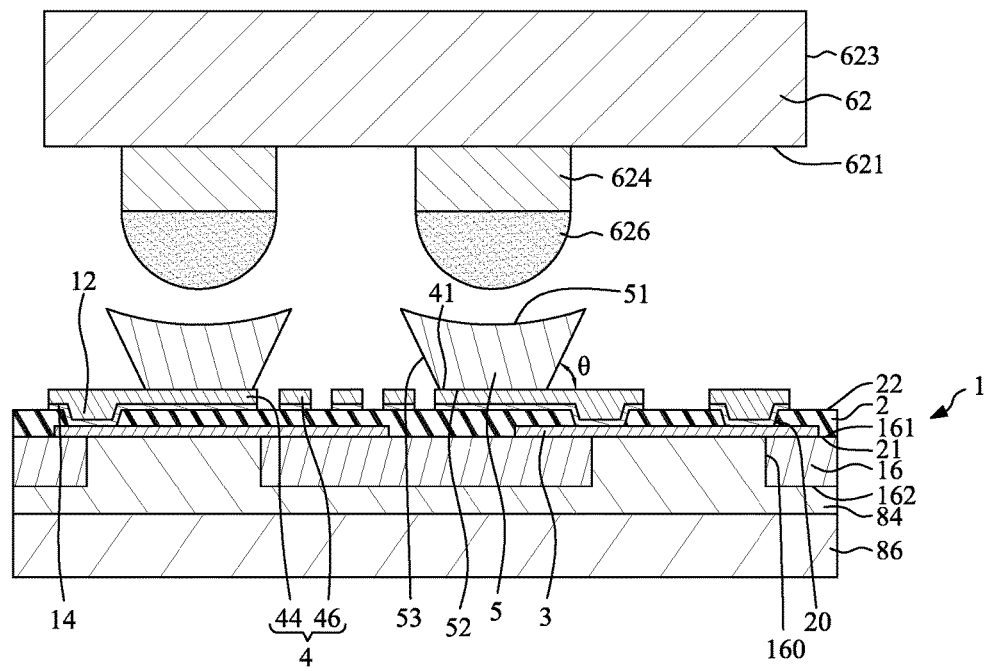
FIG. 21 illustrates one or more stages of an example of a semiconductor process according to some embodiments of the present disclosure.

Referring to FIG. 21, a semiconductor die 62 is provided. The semiconductor die 62 has an active surface 621 and a side surface 623, and includes at least one bump 624 and at least one solder structure 626 connected to the at least one bump 624.

Figure 22:
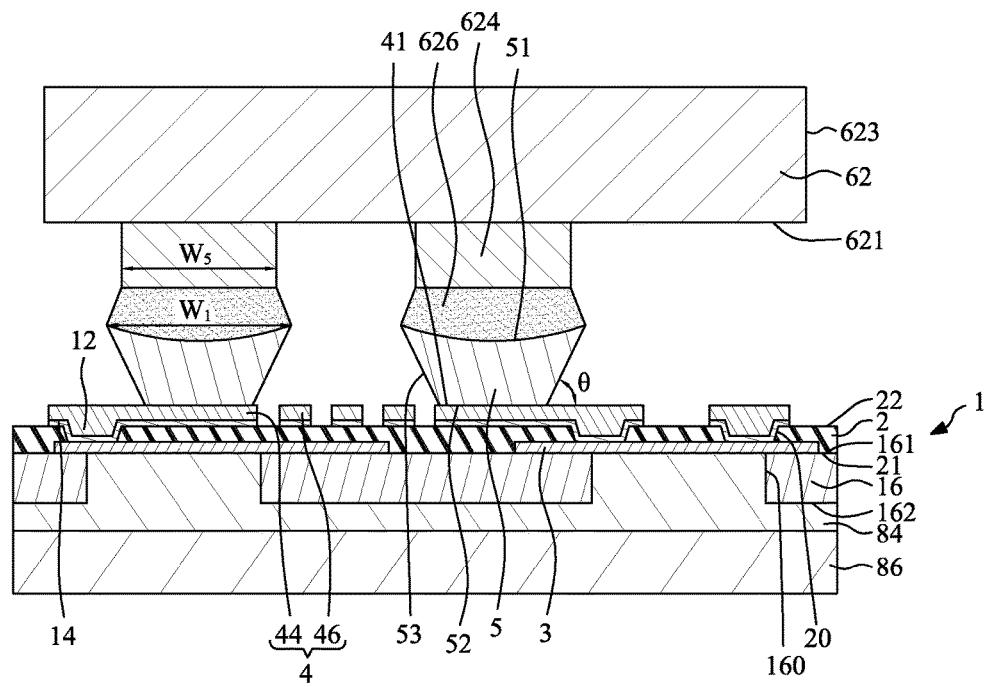
FIG. 22 illustrates one or more stages of an example of a semiconductor process according to some embodiments of the present disclosure.

Referring to FIG. 22, the semiconductor die 62 is disposed on and connected to the substrate structure 1 (e.g., by a reflow process). The active surface 621 of the semiconductor die 62 faces the substrate structure 1. The semiconductor die 62 is electrically connected to the conductive pillar 5 of the substrate structure 1. The bump 624 of the semiconductor die 62 is connected to the conductive pillar 5 of the substrate structure 1 through the solder structure 626. In some embodiments, the solder structure 626 contacts the upper surface 51 of the conductive pillar 5. A width $W_1$ of the upper surface of the conductive pillar 5 is greater than a width $W_5$ of the bump 624 of the die 62.

Figure 23:
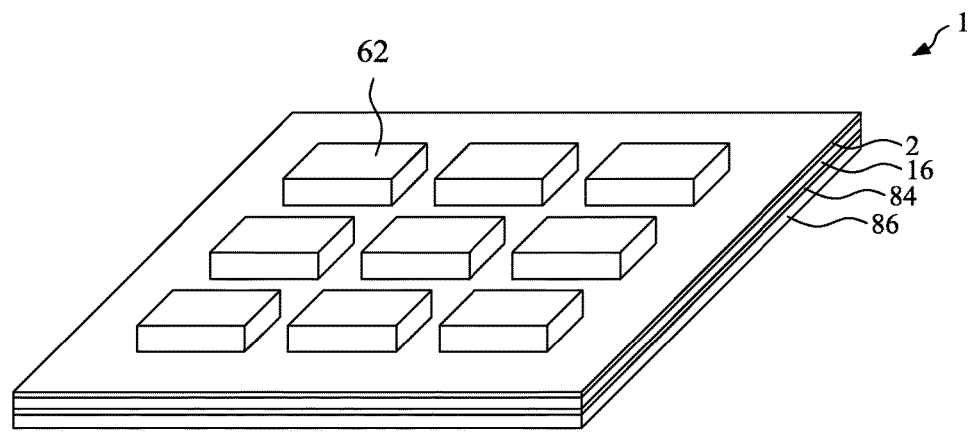
FIG. 23 illustrates a schematic perspective view of an example of a combination of a carrier, a substrate structure and a plurality of semiconductor dice.

FIG. 23 illustrates a schematic perspective view of an example of a combination of a carrier 86, a substrate structure 1 and a plurality of semiconductor dice 62 (e.g. as depicted in FIG. 22) according to some embodiments of the present disclosure. The shapes of the substrate structure 1 and the carrier 86 may be, for example, rectangular or square.

Figure 24:
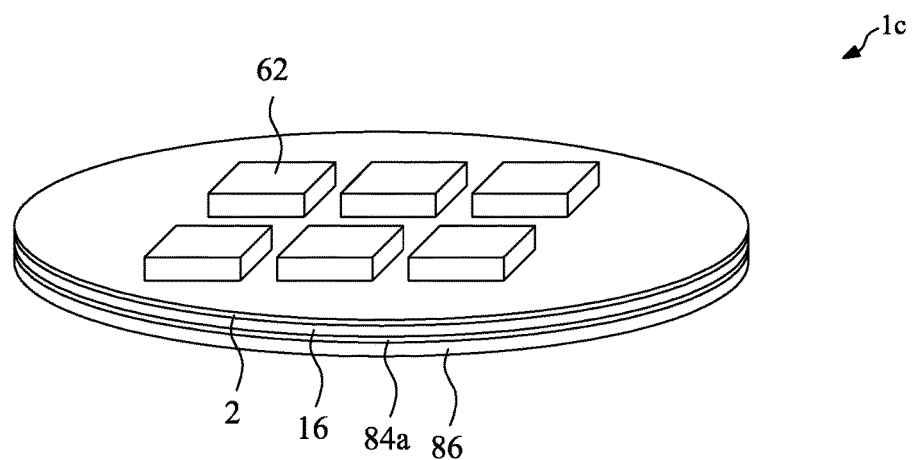
FIG. 24 illustrates a schematic perspective view of another example of a combination of a carrier, a substrate structure and a plurality of semiconductor dice.

FIG. 24 illustrates a schematic perspective view of another example of a combination of a carrier 86a, a substrate structure 1c and a plurality of semiconductor dice 6 according to some embodiments of the present disclosure. The shapes of the substrate structure 1c and the carrier 86a may be, for example, circular or elliptical.

Figure 25:
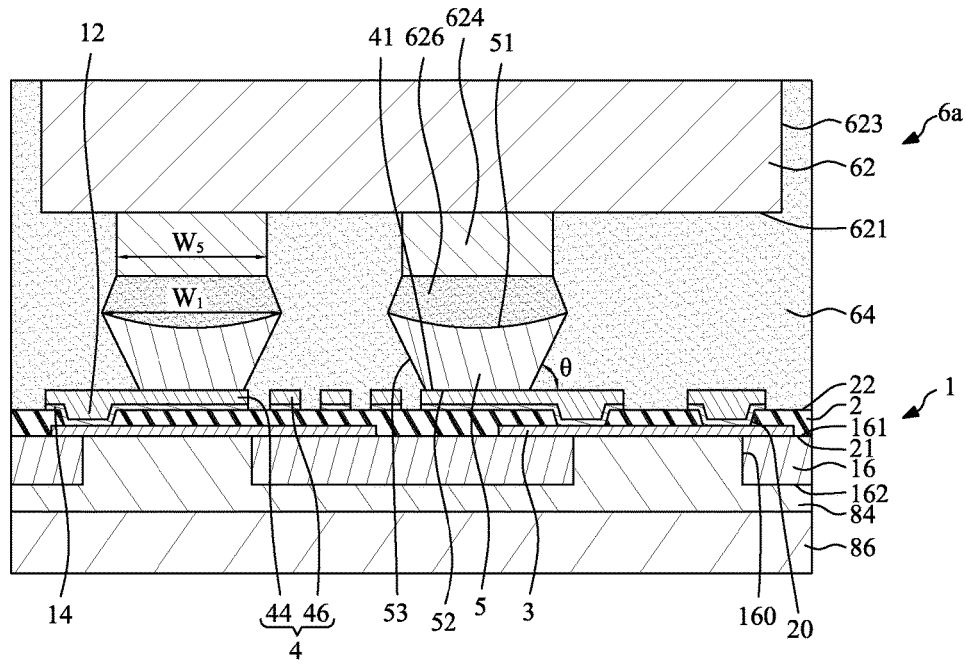
FIG. 25 illustrates one or more stages of an example of a semiconductor process according to some embodiments of the present disclosure.

Referring to FIG. 25, an encapsulant 64 is disposed or formed between a semiconductor die 62 and a substrate structure 1, and directly contacts a portion of a second circuit layer 4. The encapsulant 64 may cover an active surface 621 and a side surface 623 of the semiconductor die 62. In some embodiments, the encapsulant 64 covers (e.g. completely covers) the sidewall 53 of the conductive pillar 5. For example, the encapsulant 64 directly contacts the sidewall 53 of the conductive pillar 5. In some embodiments, the encapsulant 64 contacts a portion of the second surface 22 of the dielectric layer 2 of the substrate structure 1.

Figure 26:
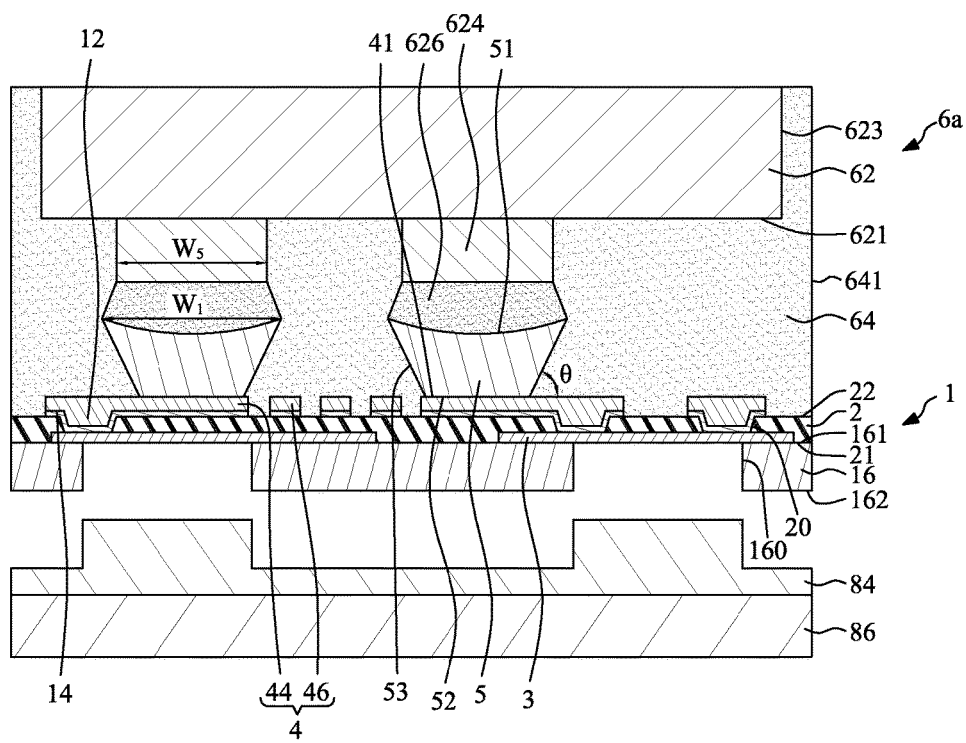
FIG. 26 illustrates one or more stages of an example of a semiconductor process according to some embodiments of the present disclosure.

Referring to FIG. 26, the carrier 86 and the adhesion layer 84 are removed. Then, a solder ball 18 is disposed in the opening 160 of the protective layer 16 and attached to the first circuit layer 3 for external connection. Then, a singulation process is performed, thus forming the semiconductor package structure 6a as shown in FIG. 5. In other embodiments, the semiconductor dice 62 shown in FIG. 23 or FIG. 24 may be replaced by a single wafer. Hence, after the singulation process, the encapsulant 64 may not cover the side surface 623 of the semiconductor die 62, and a side surface 641 of the encapsulant 64 may be substantially coplanar with the side surface 623 of the semiconductor die 62, forming the semiconductor package structure 6 as shown in FIG. 4

Figure 27:
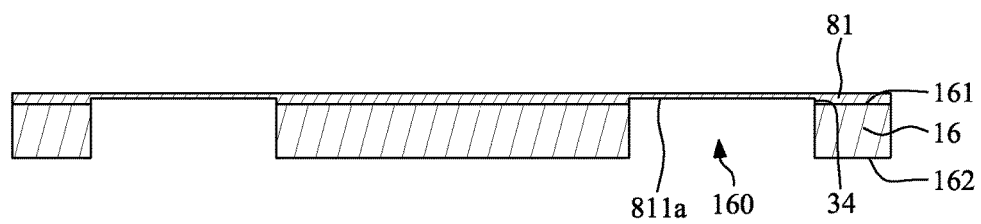
FIG. 27 illustrates one or more stages of an example of a semiconductor process according to some embodiments of the present disclosure.

FIG. 27 illustrates a semiconductor process according to some embodiments of the present disclosure. In some embodiments, the semiconductor process is for manufacturing a substrate structure such as the substrate structure 1a shown in FIG. 2 and FIG. 3, and/or a semiconductor package structure including such substrate structure.

The initial stages of the illustrated process are the same as the stages illustrated in FIG. 7 through FIG. 9. FIG. 27 depicts a stage subsequent to that depicted in FIG. 9. Referring to FIG. 27, the protective layer 16 is developed by a developer. The protective layer 16 defines an opening 160 extending through the protective layer 16. During the devolving process, a portion 811a of the metal layer 81 exposed in the opening 160 of the protective layer 16 is also etched. Hence, the portion 811a of the metal layer 81 is slightly recessed to form a recess portion 34.

The stages subsequent to FIG. 27 of the illustrated process are similar to the stages illustrated in FIG. 11 through FIG. 26. The portion 811a forms the first portion 31 of the first circuit layer 3, thus forming the substrate structure 1a as shown in FIG. 2 and FIG. 3 and/or the semiconductor package structure including the same.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90°—that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a surface can be deemed to be planar or substantially planar if a difference between a highest point and a lowest point of the surface is no greater than 5 no greater than 2 no greater than 1 or no greater than 0.5 μm.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
   a dielectric layer having a first surface and a second surface opposite to the first surface;
   a first circuit layer disposed adjacent to the first surface of the dielectric layer;
   a second circuit layer disposed adjacent to the second surface of the dielectric layer and electrically connected to the first circuit layer, wherein the second circuit layer comprises a plurality of pads and at least one trace disposed between two adjacent pads of the plurality of pads; and
   at least one conductive pillar tapered toward the second circuit layer and disposed on one of the pads of the plurality of pads;
   wherein a portion of the second surface of the dielectric layer is exposed from the second circuit layer.

2. The substrate structure of claim 1, wherein the at least one conductive pillar is directly disposed on the one of the pads of the plurality of pads of the second circuit layer.

3. The substrate structure of claim 2, wherein the at least one conductive pillar and the second circuit layer share a lattice.

4. The substrate structure of claim 1, wherein the at least one conductive pillar has an upper surface, and the upper surface of the at least one conductive pillar is concave.

5. The substrate structure of claim 1, wherein the at least one conductive pillar has a sidewall and the second circuit layer has an upper surface, and an angle defined by the sidewall of the at least one conductive pillar and the upper surface of the second circuit layer is equal to or greater than 60 degrees and less than 90 degrees.

6. The substrate structure of claim 1, wherein the at least one conductive pillar comprises an upper portion, and an edge of the upper portion of the at least one conductive pillar is located directly above the at least one trace of the second circuit layer.

7. The substrate structure of claim 1, wherein the first circuit layer is embedded in the dielectric layer and exposed from the first surface of the dielectric layer.

8. The substrate structure of claim 7, wherein the first circuit layer comprises a first portion and a second portion surrounding the first portion and having a surface, and the surface of the second portion is substantially coplanar with the first surface of the dielectric layer.

9. The substrate structure of claim 8, wherein the first portion of the first circuit layer has a surface that is recessed from the first surface of the dielectric layer.

10. The substrate structure of claim 8, further comprising a protective layer defining an opening that exposes the first portion of the first circuit layer.

11. The substrate structure of claim 10, wherein a width of the opening of the protective layer is substantially the same as a width of the first portion of the first circuit layer.

12. A semiconductor package structure, comprising:
   a substrate structure, comprising:
      a dielectric layer, having a first surface and a second surface opposite to the first surface;
      a first circuit layer disposed adjacent to the first surface of the dielectric layer;
      a second circuit layer disposed adjacent to the second surface of the dielectric layer and electrically connected to the first circuit layer, wherein the second circuit layer comprises a plurality of pads and at least one trace disposed between two adjacent pads of the plurality of pads; and
      at least one conductive pillar tapered toward the second circuit layer and disposed on one of the pads of the plurality of pads;
   a semiconductor die electrically connected to the at least one conductive pillar of the substrate structure; and
   an encapsulant disposed between the substrate structure and the semiconductor die, and directly contacting a portion of the second circuit layer.

13. The semiconductor package structure of claim 12, wherein the die has an active surface facing the substrate structure.

14. The semiconductor package structure of claim 12, wherein the at least one conductive pillar has a sidewall, and the encapsulant covers the sidewall of the at least one conductive pillar.

15. The semiconductor package structure of claim 12, wherein the semiconductor die comprises at least one bump and at least one solder structure, and the solder structure is disposed between the at least one conductive pillar and the bump.

16. The semiconductor package structure of claim 15, wherein the at least one conductive pillar has a concave upper surface, and the solder structure contacts the upper surface of the at least one conductive pillar.

17. The semiconductor package structure of claim 15, wherein the at least one conductive pillar has an upper surface having a width greater than a width of the bump of the die.

18. The semiconductor package structure of claim 12, wherein the at least one conductive pillar is directly disposed on the one of the pads of the plurality of pads of the second circuit layer, and the at least one conductive pillar shares a lattice with the second circuit layer.

19. The semiconductor package structure of claim 12, wherein the encapsulant contacts a portion of the second surface of the dielectric layer of the substrate structure.

20. The substrate structure of claim 10, wherein the first circuit layer defines a recess portion corresponding to the first portion, and the recess portion of the first circuit layer is substantially co-extensive with the opening of the protective layer.

* * * * *